US006348076B1

(12) United States Patent
Canaperi et al.

(10) Patent No.: US 6,348,076 B1
(45) Date of Patent: Feb. 19, 2002

(54) SLURRY FOR MECHANICAL POLISHING (CMP) OF METALS AND USE THEREOF

(75) Inventors: Donald F. Canaperi, Bridgewater, CT (US); William J. Cote, Poughkeepsie, NY (US); Paul Feeney, Aurora, IL (US); Mahadevaiyer Krishnan; Joyce C. Liu, both of Hopewell Junction, NY (US); Michael F. Lofaro, Milton, NY (US); Philip Murphy, New Fairfield, CT (US); Eric Jeffrey White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/472,961

(22) Filed: Dec. 28, 1999

Related U.S. Application Data

(60) Provisional application No. 60/158,692, filed on Oct. 8, 1999.

(51) Int. Cl.[7] .............................. C09G 1/02; C09G 1/04; B24B 1/00

(52) U.S. Cl. .............................. 51/309; 51/307; 51/308; 106/3; 438/692; 438/693; 451/36

(58) Field of Search .......................... 51/309, 307, 308; 106/3; 438/692, 693; 451/36

(56) References Cited

U.S. PATENT DOCUMENTS

| 5,676,587 | A | | 10/1997 | Landers et al. ................ 451/57 |
|---|---|---|---|---|
| 5,860,848 | A | * | 1/1999 | Loncki et al. ................. 451/36 |
| 5,876,490 | A | * | 3/1999 | Ronay .......................... 51/309 |
| 5,954,997 | A | * | 9/1999 | Kaufman et al. ........... 252/79.1 |
| 5,993,686 | A | * | 11/1999 | Streinz et al. ................. 51/309 |
| 6,063,306 | A | * | 5/2000 | Kaufman et al. ........... 438/693 |
| 6,171,352 | B1 | * | 1/2001 | Lee et al. ..................... 51/308 |

* cited by examiner

Primary Examiner—Michael Marcheschi
(74) Attorney, Agent, or Firm—Connolly Bove Lodge & Hutz; Robert M. Trepp, Esq.

(57) ABSTRACT

Slurry compositions comprising an oxidizing agent, copper corrosion inhibitor, abrasive particles; surface active agent and polyelectrolyte are useful for polishing or planarizing chip interconnect/wiring material such as Al, W and especially Cu.

26 Claims, 2 Drawing Sheets

SLURRY FOR MECHANICAL POLISHING (CMP) OF METALS AND USE THEREOF

CROSS-REFERENCE TO RELATED APPLICATION

This application claims priority from provisional patent application Ser. No. 60/158,692 filed Oct. 8, 1999.

TECHNICAL FIELD

The present invention relates to slurry compositions that are especially useful for polishing or planarizing a surface. The present invention is especially use for polishing or planarizing copper used as interconnect wiring in integrated circuit devices such as semiconductor wafers containing copper damascene and dual damascene features. The present invention also relates to polishing processes employing the compositions of the present invention.

BACKGROUND OF THE INVENTION

In the microelectronics industry, during the manufacture of an integrated circuit, surfaces that are typically scratch-free are polished for the purpose of planarizing the structure involved and/or removing unwanted material. The polishing involved is chemical mechanical polishing (CMP). For example, metals such as aluminum, copper, and tungsten are planarized. Moreover, there is typically a refractory metal liner beneath the aluminum, copper or tungsten providing good adhesion to the underlying insulator and good contact resistance to lower level moralizations. The liners can be niobium, tantalum and titanium alone or in combination with their nitrides, or any other refractory metal. Recently copper and alloys of copper have been developed as the chip interconnect/wiring material especially for VLSI and ULSI semiconductor chips.

The use of copper and copper alloys results in improved device performance when compared to Al and its alloys.

In fabricating the semiconductor devices, the metallic interconnect material of wiring structure such as copper or its alloys typically starts as a blanket electrodeposited film over a layer of dielectric which has trenched features etched into its surface. The deposited copper film fills the pre-etched gaps or trenches in the dielectric, and leaves a metal overabundance on the surface of the wafer which must be removed. Once the metal overabundance has been removed, an inlaid metal wiring structure is left on the surface of the wafer. This process is referred to as the damascene process. In general, the chemical mechanical polishing (CMP) involves a circular/orbital motion of a wafer under a controlled downward pressure with a polishing pad saturated with a conventional polishing slurry. In this manner, removal of the metal overabundance, and replanarization of the wafer surface is accomplished. More recently, polishing pads which are impregnated with suitable abrasive particles are being used for CMP processing. For a more detailed explanation of chemical mechanical polishing, please see U.S. Pat. Nos. 4,671,851, 4,910,155 and 4,944,836, the disclosures of which are Incorporated herein by reference.

Polishing slurries used for CMP of metals are typically aqueous suspensions comprised of a metal oxide abrasive such as alumina or silica, organic acids, surfactants, chelates, and a suitable oxidizing agent. The role of the abrasive is to facilitate material removal by mechanical action. The oxidizing agent works to enhance mechanical removal via a corrosion assisted process. Such oxidizing agents employed in commercially-available or proprietary slurries are typically inorganic metal salts such as $FeNO_3$, or $KIO_3$, as well as hydrogen peroxide, present in significant concentrations. Other chemicals added to slurries to improve dispersion or otherwise enhance performance often are inorganic acids (e.g. HCl, $H_2SO_4$, $HNO_3$) Sodium, potassium, and iron salts and/or compounds are frequently used in slurry formulations. Complexing or chelating agents are present to prevent free copper ion buildup in the process slurry which can lead to pad discoloration and increased oxidizer reactivity. These additives generally improve the polish performance of the CMP slurry.

One concern with current CMP slurries for Cu is that they provide polish rates of 1500 to 1700 Angstroms/minutes. Thus long polish times are required to remove 1 to 2 microns of Cu in Back End Of the Line (BEOL) applications. In addition, these processes employ high downforce, typically about 6 psi. This coupled with a high overpolish times result in severe Cu dishing and oxide erosion.

It would therefore be desirable to provide a process for polishing of Cu which overcomes the dishing and erosion problems. Moreover, the polishing process should also avoid scratching the copper surface, which is susceptible to scratching because it is relatively soft. Furthermore, the polishing slurry should provide high selectively towards Cu versus any liner material in contact with the Cu.

Further, by way of background, a description of selective polishing and CMP can be found in U.S. Pat. No. 5,676,587 to Landers at al. entitled "Selective Polish Process for Titanium, Titanium Nitride, Tantalum Nitride" which is incorporated herein by reference. Further, Ser. No. 09/307,123 filed May 7, 1999 to Feeney et al. (BU998-100) entitled "CMP Slurry of Tantalum", which is incorporated herein by reference, is referenced to show slurry compositions and their use. Also, Ser. No. 60/105,470 filed Oct. 23, 1998 by P. M. Feeney et al. (BU997-115) entitled "(PF/CUPI/JB) Method of Fabricating Copper Wiring Utilizing Chemical-Mechanical Polish" which is incorporated herein by reference shows an example of a slurry and if Cu CMP polishing. In addition, Ser. No. 08/965,218 filed Nov. 6, 1997 U.S. Pat. No. 6,102,237 by C. Huynh et al. (YO-997229A), entitled "A PH-Buffered Slurry and Use Thereof For Polishing" which is incorporated herein by reference to shows an example of a slurry composition.

SUMMARY OF THE INVENTION

The present invention provides slurry compositions having significantly increased polish rates such as at least about 3,000 angstroms/minute, along with the need for a relatively low downforce of 6 psi or less. Accordingly, the present invention provides a significant reduction in polish times. The invention provides a slurry that can operate with low down force resulting in minimization of Cu recess and oxide erosion during CMP.

Moreover, the present invention provides a slurry that provides high selectivity towards Cu versus one of Ta, TaN, Ti, TiN, W, combinations thereof, and other liner materials by a judicious selection of the components of the composition and their relative amounts. In particular, the present invention relates to a slurry composition comprising about 10 to about 50 grams/liter of an oxidizing agent; about 1 to about 5% by weight of abrasive particles; about 0.5 to about 30 ml/l of a surface active agent; and about 0.1 to about 5 grams/liter of a polyelectrolyte. In addition, when the compositions are used for polishing copper, about 0.5 to about 5 grams/liter of a copper corrosion inhibitor are also included in the composition Preferably, the slurry combination comprises two parts wherein Part A comprises the oxidizing agent, and abrasive particles; Part B comprises the surface active agent and polyelectrolyte; and, when employed, the copper corrosion inhibitor can be included in Part A and/or Part B.

The present invention provides a slurry that leaves a cleaner polished surface.

The present invention also relates to polishing a surface which comprises providing an the surface to be polished the above disclosed slurry; and polishing the surface by contacting it with a polishing pad.

According to preferred aspects of the present invention, the polishing process comprises point of use mixing by separately applying Part A and Part B to the surface to be polished and the polishing the surface by contacting it with a polishing pad.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not restrictive.

BEST AND VARIOUS MODES FOR CARRYING OUT INVENTION

Figure 1:
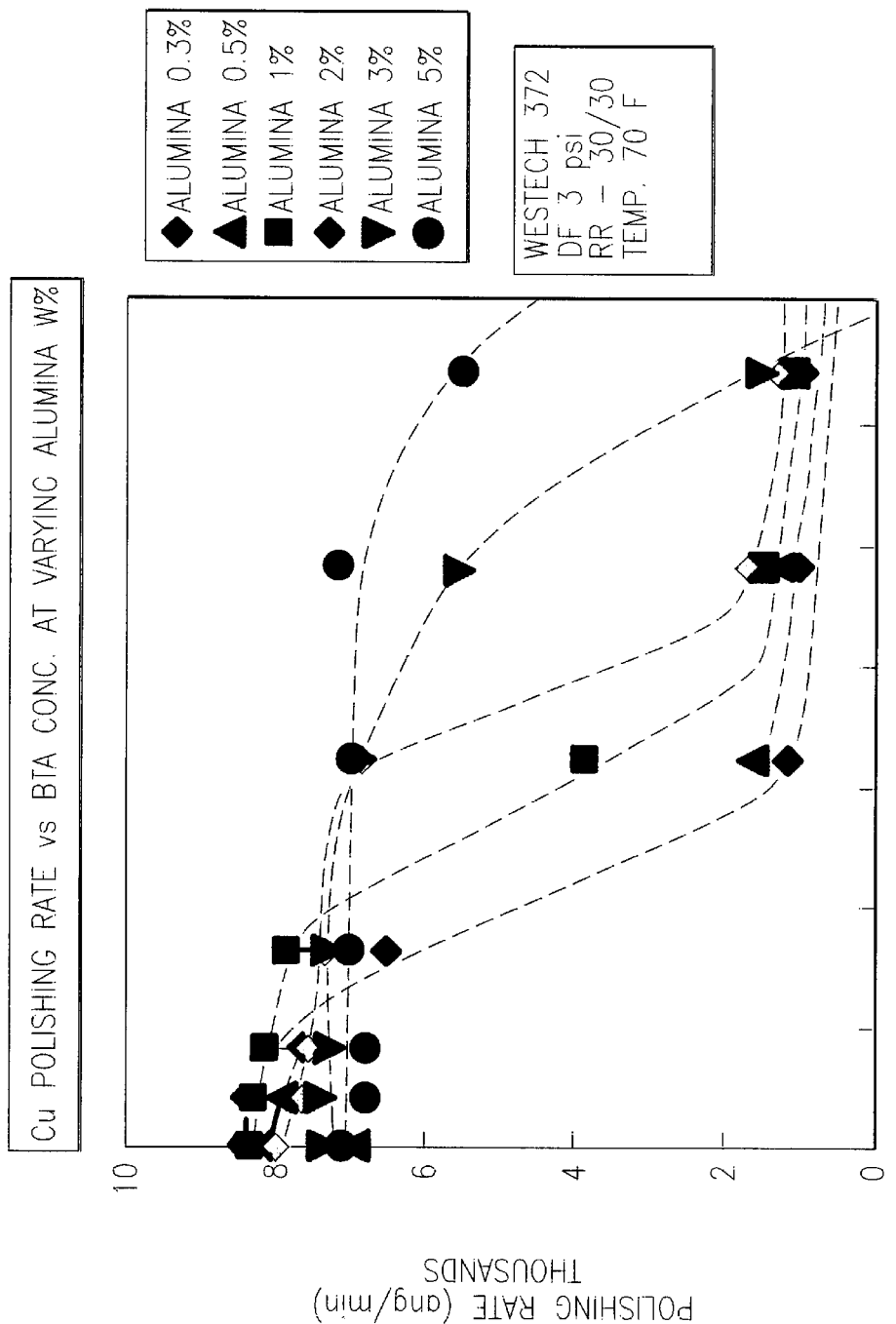
FIG. 1 shows the variation of Cu polish rates as a function of Benzotriazole(BTA)concentration at various Alumina concentrations.

The slurry compositions of the present invention comprise an oxidizing agent. Suitable oxidizing agents include oxidizing metal salts, oxidizing metal complexes, oxidizing acids such as nitric, persulfuric, peracetic and periodic acids, iron salts such as nitrates, sulfates, EDTA and citrates; potassium ferricyanide, hydrogen peroxide, aluminum salts, sodium salts, potassium sch as potassium iodate, ammonium salts such as ammonium cerium nitrate, quaternary ammonium salts, phosphonium salts, chlorates, perchlorates such as potassium percholate, nitrates, permaganates such as potassium permanganate, persulfates and mixtures thereof.

The preferred oxidizing agent is ferric nitrate. The oxidizing agent(s) are typically present in the composition in amounts of about 10 to about 50 grams/liter, and preferably about 20 grams/liter.

The compositions of the present invention, when employed to polish copper, also include a copper corrosion inhibitor. When the compositions are used for polishing Al or W, they can and preferably also include a copper corrosion inhibitor. Typical copper corrosion inhibitors include triazoles such as 1,2,4-triazole and benzotriazole. The amount of the copper corrosion inhibitor is typically about 0.5 to about 5 grams/liter, and preferably about 1.25 grams/liter.

The compositions of the present invention also include abrasive particles. The abrasive particles employed include those conventionally used in polishing slurries. Examples of suitable abrasive particles include alumina, silica, ferric oxide, zirconia, ceria, and titanium dioxide and mixtures thereof. The preferred abrasive is alumina. Also, the abrasive particles can include a dual-valent rare earth ion or suspension of its colloidal hydroxide, wherein the rare earth ion is in its higher valent form. Examples of some suitable rare earths are $Ce^{4+}$, $Pr^{4+}$ and $Tb^{4+}$ or suspensions of their colloidal oxides, such as cerium oxide. The dual-valent rare earth or rare earth oxide colloid acts as an oxidation catalyst.

Dual-valent rare earth additives, such as those disclosed in the co-pending U.S. patent application Ser. No. 08/756, 361, U.S. Pat. No. 6,110,396 the entire disclosure of which is hereby incorporated by reference, may be part of the polishing slurry.

The abrasive particles typically have a particle size of about 10 to about 1000 nanometers and preferably about 50 to about 200 nanometers. The amount of abrasive particles is typically about 1% to about 5% by weight, and preferably about 2% by weight.

Also, the slurry of the present invention is preferably an aqueous slurry. Other types of suitable slurries include those using the diluent organic solvents such as propylene carbonate and mono and polyhydric alcohols such as methanol, ethanol, ethylene glycol and glycerol. Of course, mixtures of these diluents as well as mixtures with water can be used when desired.

The compositions of the present invention also contain a surface active agent. Suitable surface active agents include anionic, cationic, nonionic and zwitterionic compounds. Examples of some surfactants for use in the present invention are disclosed in, for example, Kirk-Othmer, *Encyclopedia of Chemical Terminology*, 3rd Edition, Vol. 22 (John Wiley & Sons, 1983), Sislet & Wood, *Encyclopedia of Surface Active Agents* (Chemical Publishing Co., Inc. 1964), McCutcheon's *Emulsifiers & Detergents, North American and International Edition* (McCutcheon Division, The MC Publishing Co., 1991), Ash, *The Condensed Encyclopedia of Surfactants* (chemical Publishing Co., Inc., 1989), Ash, *What Every Chemical Technologist Wants to Know About . . . Emulsifiers and Wetting Agents*, Vol. 1 (Chemical Publishing Co., Inc., 1988), Tadros, Surfactants (Academic Press, 1984), Napper, *Polymeric Stabilization of Colloidal Dispersion* (Academic Press, 1983) and Rosen, *Surfactants & Interfacial Phenomena*, $2^{nd}$ Edition (John Wiley & sons, 1989), all of which are incorporated herein by reference. Typical examples of suitable surface active agents are: Na-alkyl sulfates, Na-alkyl sulfonates, Quarternary ammonium salts, and Nonyl ethers. Preferred surface active agents are sulfates such as Na -hexyl, -heptyl, -octyl, nonyl and -lauryl sulfates with Na octyl sulfate being most preferred. Na octyl sulfate is commercially available under its trade designation of DUPANOL. The surfactants provide for achieving cleaner surfaces by removing abrasive residues after CMP and brush cleaning.

The amount of surface active agent is typically about 0.5 to about 30 ml/l and preferably about 12 ml/l.

The composition of the present invention also includes a polyelectrolyte. The term polyelectrolyte refers to a substance that contains polyions, which are macro-molecules having a large number of ionizable groups. To preserve the electroneutrallity of a polyelectrolyte substance, the polyion charges must be compensated by counterions, typically ions of low molecular weight such as H+or Na+. Unlike most uncharged polymers, polyelectrolytes usually are soluble in polar solvents, e.g. water. With regard to their protonation equilibria in aqueous solution, they can be classified as polyacids, polybases, or, if both acidic and basic groups are present, as polyampholytes. The polyelectrolytes can include:

1. Acidic groups such as carboxyl groups, for example in poly(acrylic acid), poly(methacrylic acid), poly(methyl methacrylic acid), poly(maleic acid), or in saturated or unsaturated poly(carboxylic acid)s. Also,phosphoric acid and/or sulfonic acid groups incorporated into a polymer may act as acidic functional groups; or
2. Basic groups including nitrogen containing groups such as polymers with amino, amide, imide, vinyl pyridine, piperidine and piperazine derivatives.

Examples of some polyelectrolytes are poly(acrylic acid), poly(methacrylic acid), poly(vinylsulfonic acid), poly (acrylic acid-co-maleic acid), poly(vinylamine), poly (ethylenimine) and poly(4-vinylpyridine). The preferred polyelectrolytes are poly(acrylic acid) and poly(acrylamide) and their copolymers. The polyelectrolytes used typically have molecular weight of about 1,000 to about 10,000 and preferably about 2,000. The polyelectrolyte is typically employed in the composition in amount s of about 0.1 to about 5.0 grams/liter and preferably about 1 gram/liter.

The polyelectrolytes are good dispersants for abrasive particles such as alumina in water. They are used in the slurry to prevent the formation of pits on the metal surface such as the Cu surface. For example, in general, due to the high affinity of alumina to Cu surface, slurry soaked alumina tends to stick to Cu surface resulting in the formation of pits. The polyelectrolytes such as poly(acrylic acid), poly (acrylamide) and their copolymers prevent the alumina from sticking to the Cu surface and hence prevent the formation of pits.

Current prior art slurry compositions exhibit a linear dependence of rate on downforce as described by the Preston equation. This severely limits the ability to achieve higher rates. The slurry system of the instant invention overcomes this limitation. Thus higher rates can be achieved at a lower downforce. According to preferred aspects of the present invention, the slurry component comprises two parts wherein Part A comprises the oxidizing agent, and abrasive particles; and part B comprises the surface active agent and polyelectrolyte; and the copper corrosion inhibitor, when employed, is present in Part A and/or Part B. Typically, the amount of diluent such as the water in Part A is about 90–95% by weight and more typically is about 90–92% by weight. Typically, the amount of diluent such as water in Part B is about 96–98% by weight and more typically is about 98–99% by weight. Typically, the volume ratio of Part A and Part B is about 0.7:1 to about 1.3:1, more typically about 0.8:1 to about 1.2:1 and even more typically about 1:1.

The composition is therefore preferably employed by providing two separate streams of the slurry portions to the substrates for polishing comprising the Part A in a first stream and the Part B in a second stream. Using two streams of Part A and Part B provide a point of use mixing to achieve lower metallurgical defects such as scratches, pits and the like on a semiconductor wafer with metal thereon being polished.

This makes it possible to separately filter the streams right before use removing potentially scratch producing particles, such as aggregates and contaminants. However, when the abrasive particles are combined prematurely, with the polyelectrolyte, the particles tend to fluctuate somewhat, increasing their size which might not be desirable.

The compositions of the present invention and especially the preferred concentrations of the components result in high polish rates of Cu at low downforce, good selectivity of Cu with respect to other liner materials such as Ta and Ti, cleaner surface after rinsing, better final topography and lower metallurgical defects such as scratching, pitting and the like.

The slurry compositions of the present invention is useful for polishing Cu, W. and Al and their alloys and is selective to Cu, W and Al with respect to Ti, TiN, Ta and TaN.

The structures treated pursuant to the present invention are typically semiconductor devices having copper interconnectors (lines, plugs, vias, global and local interconnects) imbedded into a dielectric material such as silicon dioxide, which may also include a capping layer, such as silicon nitride as in low k dielectric/damascene and dual damascene structures. The silicon dioxide is typically a high density plasma deposited silicon dioxide or TEOS (tetraethylorthosilicate).

The copper interconnects typically use tantalum, tantalum nitride, titanium or titanium nitride or a combination thereof as a barrier or liner material between the copper and the dielectric. As such, the CMP composition contacts a variety of different materials, copper, the dielectric or capping layer, as well as the wafer backside, which is generally a thin layer of oxidized silicon.

Accordingly, the polishing composition must be also selective to remove the metal as contrasted to the dielectric.

The present invention makes it possible to achieve high polish rates of Cu at low downforce. For example, the downforce employed can be as low as 1 psi. Typically the downforce employed is about 1–6 psi, and preferably about 2.5 to about 6 psi. The other parameters of the polishing or planarizing can be determined by those skilled in the art once aware of this disclosure, without exercising undue experimentation. For instance, the rate of rotation of the polishing platen (pads) is typically about 10 to about 70 rpm, preferably about 45–55 rpm, and the speed of the rotation of the wafer carrier typically is about 10 to about 70 rpm and preferably about 15–40 rpm. The polishing pads can be those conventionally used in polishing for microelectronics such as SUBA IV, IC 1000, IC-1400, PEDRO, PANW and POLITEX and preferably IC-1000 and PANW, medium hard pads.

The polishing rates deliverable by the present invention are typically about 3,000 to about 9,000 Angstroms/minute and more typically about 5,000 to about 6,000 angstroms/ minute.

The present invention makes it possible to reduce polishing times by at least one-half.

Figure 2:
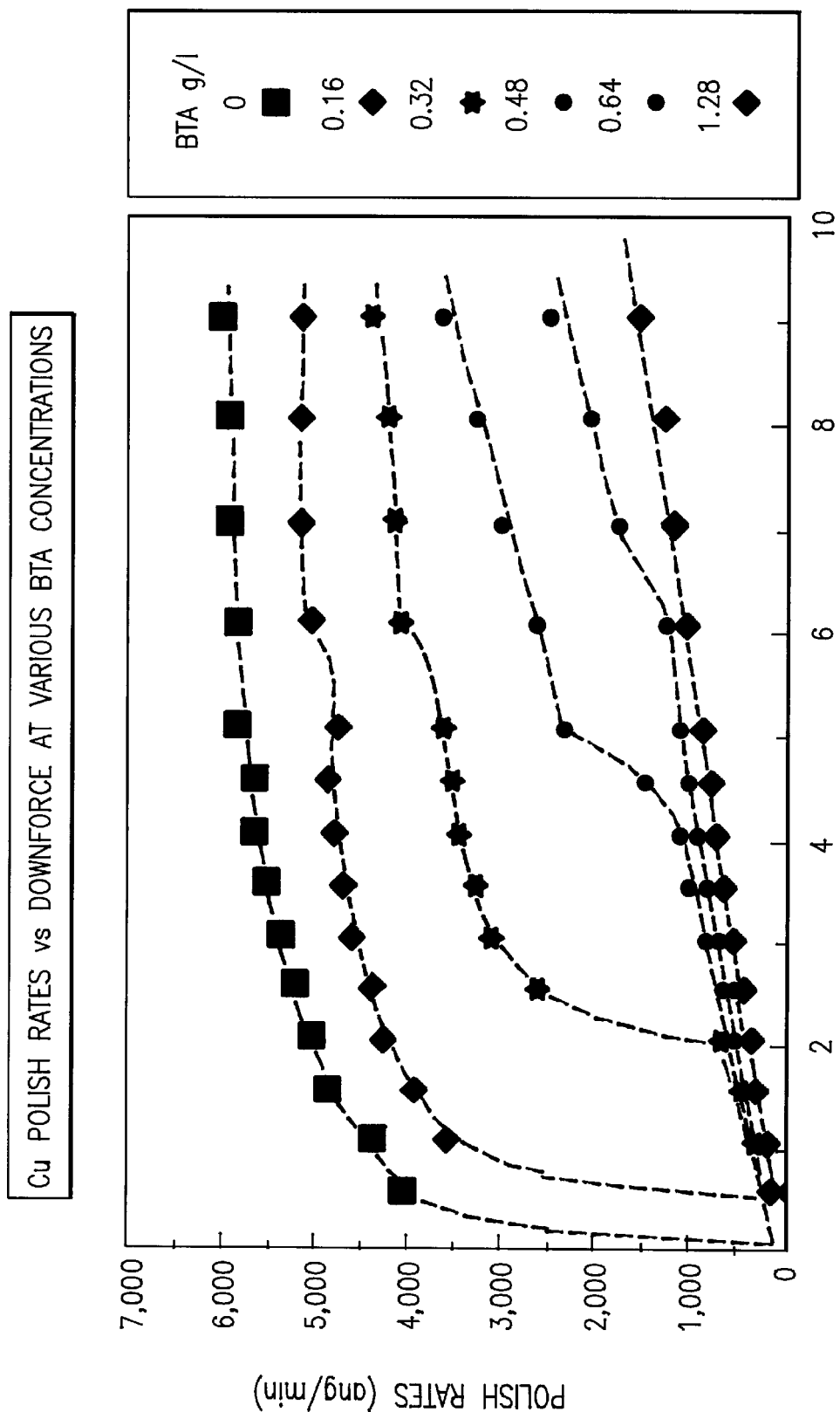
FIG. 2 shows the variations of Cu polish rates as a function of down force at various BTA concentrations.

The results illustrated in FIGS. 1 and 2 demonstrate the effectiveness of the present invention. In particular, FIG. 1 shows the variation of Cu polish rates as a function of benzotriazole (BTA) concentrations at varying alumina concentrations. It can be observed that at higher alumina concentrations Cu polish rates are higher even at high concentrations of BTA indicating good corrosion protection and high polishing rates.

FIG. 2 shows the variation of Cu polish rates as a function of Downforce at varying concentrations of BTA. This shows that high polish rates can be obtained at low downforce.

The foregoing description of the invention illustrates and describes the present invention. Additionally, the disclosure shows and describes only the preferred embodiments of the invention, but as mentioned above, it is to be understood that the invention is capable of use in various other combinations, modifications and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A two part composition wherein a first part comprises about 10 to about 50 grams/liter of an oxidizing agent; and about 1 to about 5% by weight of abrasive particles; and a second part comprising about 0.5 to about 30 ml/l of a surface active agent and about 0.1 to about 5 grams/liter of a polyelectrolyte.

2. The composition of claim 1, wherein the oxidizing agent is ferric nitrate.

3. The composition of claim 1, which further includes a copper corrosion inhibitor in the first part or second part or both.

4. The composition of claim 3 wherein the copper corrosion inhibitor comprises 1,2,4-triazole or benzotriazole.

5. The composition of claim 1 wherein the abrasive particles comprise alumina.

6. The composition of claim 1 wherein the surface active agent comprises a sulfate.

7. The composition of claim 6 wherein the sulfate is selected from the group consisting of sodium hexylsulfate, sodium heptyl sulfate, sodium octyl sulfate, sodium nonyl sulfate, and sodium lauryl sulfate, and mixtures thereof.

8. The composition of claim 1 wherein the surface active agent is selected from the group consisting of sodium alkyl sulfate, alkyl sulfonates, quaternary ammonium salts, nonyl ethers, and mixtures thereof.

9. The composition of claim 1, wherein the polyelectrolyte comprise poly(acrylic acid) or poly(acrylamide).

10. The composition of claim 1, wherein the oxidizing agent comprises ferric nitrate, the abrasive particles comprise alumina, the surface active agent comprises sodium octyl sulfate, and the polyelectrolyte comprises poly(acrylic acid).

11. The composition of claim 3, wherein the oxidizing agent comprises ferric nitrate, the copper corrosion inhibitor comprises benzotriazole, the abrasive particles comprise alumina, the surface active agent comprises sodium octyl sulfate, and the polyelectrolyte comprises poly(acrylic acid).

12. The composition of claim 1, wherein the amount of the oxidizing agent is about 20 grams/liter.

13. The composition of claim 3, wherein the amount of the copper corrosion inhibitor is about 1.25 grams/liter.

14. The composition of claim 1, wherein the amount of the abrasive particles is about 2% by weight.

15. The composition of claim 1, wherein the amount of the surface active agent is about 12 ml/l.

16. The composition of claim 1, wherein the amount of the polyelectrolyte is about 1 gram/liter.

17. The composition of claim 1, wherein the amount of the oxidizing agent is about 20 grams/liter, the amount of the abrasive particles is about 2% by weight, the amount of the surface active agent is about 12 ml/l, and the amount of the polyelectrolyte is about 1 gram/liter.

18. The composition of claim 1, being an aqueous slurry.

19. A method for polishing a surface which comprise providing on the surface a two part composition according to claim 1, whereby the first part and the second part are separately applied to the surface to be polished, followed by polishing the surface by contacting it with a polishing pad.

20. The method of claim 19, wherein the surface is selected from the group consisting of copper, aluminum, tungsten, and their alloys.

21. The method of claim 20, wherein the surface to be polished is copper or a copper alloy, and wherein the slurry composition further comprises a copper corrosion inhibitor.

22. The method of claim 21, wherein beneath the copper or copper alloy is a refractory metal intermediate layer.

23. The method of claim 22, wherein the refractory metal intermediate layer is selected from the group consisting of niobium, tantalum, titanium, nitrides thereof, and mixtures thereof.

24. The method of claim 19, wherein the polishing is carried out employing a downforce of about 1 to about 6 psi.

25. The method of claim 19, wherein the polishing is carried out employing a downforce of about 2.5 to about 6.0 psi.

26. The method of claim 19, wherein the speed of the polishing pad during the polishing is about 10 to about 70 rpm, and the speed of the wafer carrier during the polishing is about 10 to about 70 rpm.

* * * * *